United States Patent
Hou et al.

(10) Patent No.: US 6,531,395 B1
(45) Date of Patent: Mar. 11, 2003

(54) METHOD FOR FABRICATING BITLINES

(75) Inventors: Alex Hou, Kaohsiung (TW); King-Lung Wu, Tainan Hsien (TW)

(73) Assignee: United Microelectronics Corp., Hsinchu (TW)

(*) Notice: Subject to any disclaimer, the term of this patent is extended or adjusted under 35 U.S.C. 154(b) by 70 days.

(21) Appl. No.: 09/686,311

(22) Filed: Oct. 11, 2000

(30) Foreign Application Priority Data

Oct. 2, 2000 (TW) .......................... 89120452 A

(51) Int. Cl.$^7$ .............................. H01L 21/44
(52) U.S. Cl. .................. 438/664; 438/514; 438/629; 438/637; 438/641; 438/651; 438/239; 438/386; 257/68; 257/618
(58) Field of Search .................. 438/664, 514, 438/618–21, 629, 637–41, 651–56, 680–85, 239, 386; 257/618, 68

(56) References Cited

U.S. PATENT DOCUMENTS

| | | | |
|---|---|---|---|
| 4,978,634 A | * 12/1990 | Shen et al. ................ | 437/52 |
| 5,099,297 A | * 3/1992 | Hazani ...................... | 357/23.5 |
| 5,364,814 A | * 11/1994 | McQueen ................... | 437/52 |
| 5,384,478 A | * 1/1995 | Hong ........................ | 257/385 |
| 5,461,536 A | * 10/1995 | Beach et al. ............... | 361/328 |
| 5,661,053 A | * 8/1997 | Yuan ......................... | 437/43 |
| 5,981,330 A | * 11/1999 | Jenq ......................... | 438/238 |
| 6,221,762 B1 | * 4/2001 | Byun et al. ................. | 438/643 |
| 6,235,630 B1 | * 5/2001 | Akram et al. ............... | 438/643 |
| 6,242,308 B1 | * 6/2001 | Hsieh et al. ................ | 438/265 |
| 6,281,064 B1 | * 8/2001 | Mandelman et al. ....... | 438/233 |
| 6,303,437 B1 | * 10/2001 | Liu ........................... | 438/257 |
| 6,316,344 B1 | * 11/2001 | Jenq ......................... | 438/592 |
| 6,399,447 B1 | * 6/2002 | Clevenger et al. ......... | 438/268 |

FOREIGN PATENT DOCUMENTS

| | | | |
|---|---|---|---|
| EP | 1-087-443 A2 | * 9/2000 | ......... H01L/27/115 |

OTHER PUBLICATIONS

Nam et al. "A novel simplified process for fabricating a very high density p–channel trench gate power mosfet" IEEE Electron devices letters vol. 21 No. 7 Jul. 2000, p. 363–367.*
Nam et al. "A novel simplified process for fabricating a very high density p–channel trench gate power mosfet" IEEE electron device letters vol. 21 No. 7 Jul. 2000, pp. 365–367.*

* cited by examiner

Primary Examiner—Matthew Smith
Assistant Examiner—Granvill D Lee, Jr.

(57) ABSTRACT

The invention provides a method for fabricating bitlines, including the following steps: providing a semiconductor substrate having a contact opening, which opening exposed a diffusion region in the substrate or a polysilicon layer of a wordline; forming a polysilicon layer to cover the opening and contacting the exposed surface of the diffusion region or the polysilicon layer of the wordline; forming a tungsten silicide layer to cover the polysilicon layer; performing a ion implantation step with high energy and high dosage to damage a contact surface between the bitline and the wordline or a contact surface between the bitline and the diffusion region; forming a better contact surface between the bitline and the wordline or a better contact surface between the bitline and the diffusion region using thermal annealing in the subsequent steps, thereby reducing contact resistance between the bitline and the wordline or between the bitline and the diffusion region.

18 Claims, 3 Drawing Sheets

METHOD FOR FABRICATING BITLINES

CROSS-REFERENCE TO RELATED APPLICATION

This application claims the priority benefit of Taiwan application serial no. 89120452, filed Oct. 2, 2000.

BACKGROUND OF THE INVENTION

1. Field of the Invention

This invention relates in general to a method for fabricating bitlines and, in particular, a method for fabricating bitlines having reduced contact resistance.

2. Description of Related Art

A typical fabrication process for DRAM devices is the so-called 4P2M process that incorporates four layers of polysilicon and two layers of metal interconnections. The first of the four polysilicon layers employed, as viewed from the bottom of the substrate, is the polysilicon layer for the transistor gate electrode. The second layer is the polysilicon for the bitline. The third layer is the bottom electrode of the storage capacitor of the memory cell unit, while the fourth is the polysilicon for the top electrode of the storage capacitor. On the other hand, the two layers of metal interconnections are used to connect all the circuitry configurations embedded in the substrate, including the four polysilicon layers.

For the fabrication of the bitlines in typical DRAM devices, polycide made from the composition of doped polysilicon and tungsten silicide ($WSi_x$) is frequently used to form the electrical conducting wiring in the device. As a material for the contact plugs for DRAM bitlines, tungsten silicide is advantageous in that the phenomenon of static charge capacitance can be reduced in order to improve the device operating speed.

However, if the contact surface between the second polysilicon layer and the first polysilicon layer in the contact opening is not well-formed and rugged, contact resistance between the bitline and the wordline increases. Moreover, if the same situation (ragged contact surface) happens to the contact surface between the bitline and the diffusion region, contact resistance between the bitline and the diffusion region increases.

SUMMARY OF THE INVENTION

It is therefore an object of the invention to provide a method for fabricating bitlines, which reduces contact resistance between the bitline and the wordline as well as contact resistance between the bitline and the diffusion region.

The invention achieves the above-identified object by providing a method for fabricating bitlines, including the following steps: providing a semiconductor substrate having a contact opening which exposes a diffusion region in the substrate or a polysilicon layer of a wordline; forming a polysilicon layer to cover the opening and contact the exposed surface of the diffusion region or the exposed polysilicon layer of the wordline; forming a tungsten silicide layer to cover the polysilicon layer; performing a ion implantation step with high energy and high dosage to damage a contact surface between the bitline and the wordline or a contact surface between the bitline and the diffusion region; forming a better contact surface between the bitline and the wordline or a better contact surface between the bitline and the diffusion region using thermal annealing in the subsequent steps, thereby reducing contact resistance between the bitline and the wordline or between the bitline and the diffusion region.

Following the method provided in the invention, bitlines with reduced contact resistance are formed, avoiding the prior art problem of increased contact resistance due to uncompleted contact surface of the bitline. Furthermore, there is no extra annealing step, just using the annealing step in the subsequent processes, so that the thermal budget does not increase at all. The method provided in the invention is therefore compatible with the present manufacture processes used.

It is to be understood that both the foregoing general description and the following detailed description are exemplary, and are intended to provide further explanation of the invention as claimed.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
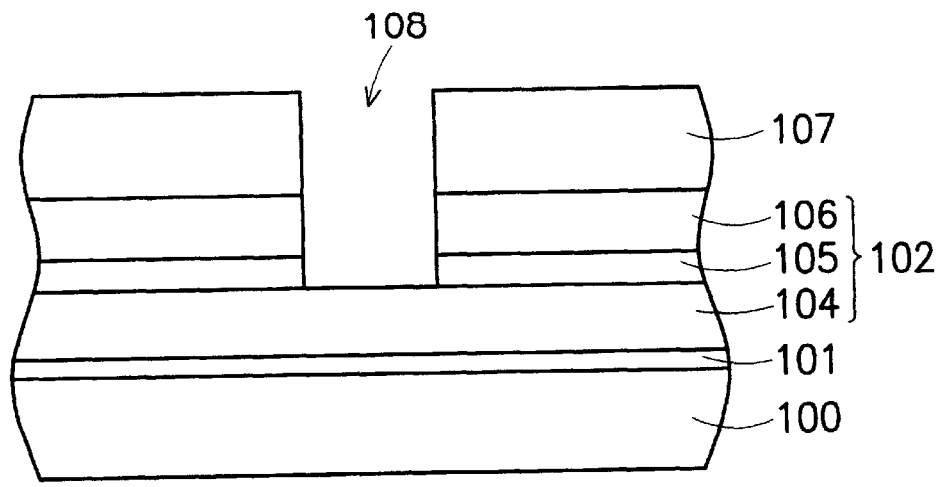
FIGS. 1A~1C are cross-sectional views of a bitline depicted from the processes in accordance with one preferred embodiment of the invention.
Figure 1B:
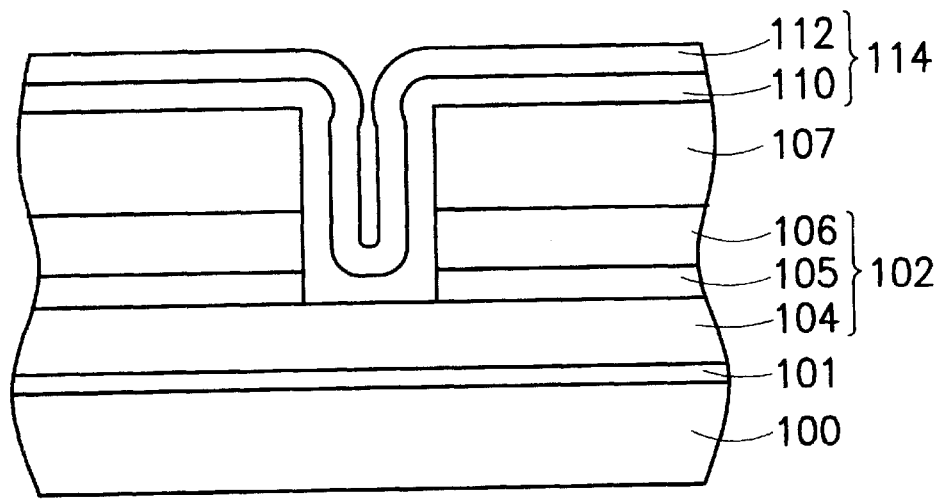
Figure 1C:
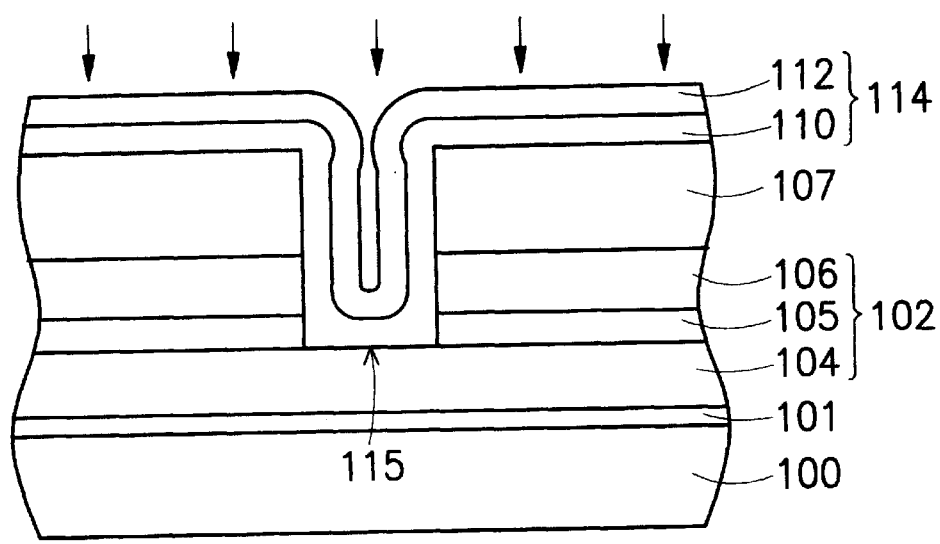

FIGS. 1A~1C are cross-sectional views of a bitline depicted from the processes in accordance with one preferred embodiment of the invention. Referring to FIG. 1A, a substrate 100, containing a filed oxide layer 101, wordline 102 and a first oxide layer 107, is provided. The wordline 102 comprises a first polysilicon layer 104, a first tungsten silicide layer 105 and a silicon nitride layer 106 formed sequentially. The first polysilicon layer 104 is, for example, TEOS-oxide formed by low-pressure chemical vapor deposition (LPCVD). Next, the first polysilicon layer 104, the first tungsten silicide layer 105 and the silicon nitride layer 106 are defined by conventional photolithography techniques, so that a bitline contact opening 108 is formed to expose a portion of the first polysilicon layer 104.

Referring to FIG. 1B, depositing a doped second polysilicon layer 110 with a thickness of about 1000 Å to cover conformally the bitline contact opening 108 and the exposed first polysilicon layer 104 in the opening. The doped second polysilicon layer 110 can be formed by, for example, in-situ doping, increasing conductivity of the polysilicon layer 110. Depositing a second tungsten silicide layer 112 with a thickness of about 1000 Å to cover conformally the doped second polysilicon layer 110. The second tungsten silicide layer is normally formed by, for example, low-pressure chemical vapor deposition (LPCVD) using tungsten hexafluoride as gas supply of tungsten in reaction with silane ($SiH_4$) under 300° C.~400° C. Tungsten silicide is advantageous in reducing static charge capacitance to improve the device operating speed. The second polysilicon layer 110 and the second tungsten silicide layer 112 forms a bitline structure 114.

Referring to FIG. 1C, an ion implantation step is performed (displayed as arrows in the figure) to implant high energy and high dosage N-type ions, for example, phosphorous ions into a contact surface 115 between the second polysilicon layer 110 and the first polysilicon layer 104, with a energy of about 100~150 Kev and a dosage of about $2 \times 10^{15} \sim 5 \times 10^{15}$. Because the ions are implanted with high energy, the lattice structure of the contact surface 115 is damaged and becomes amorphous.

Figure 3B:
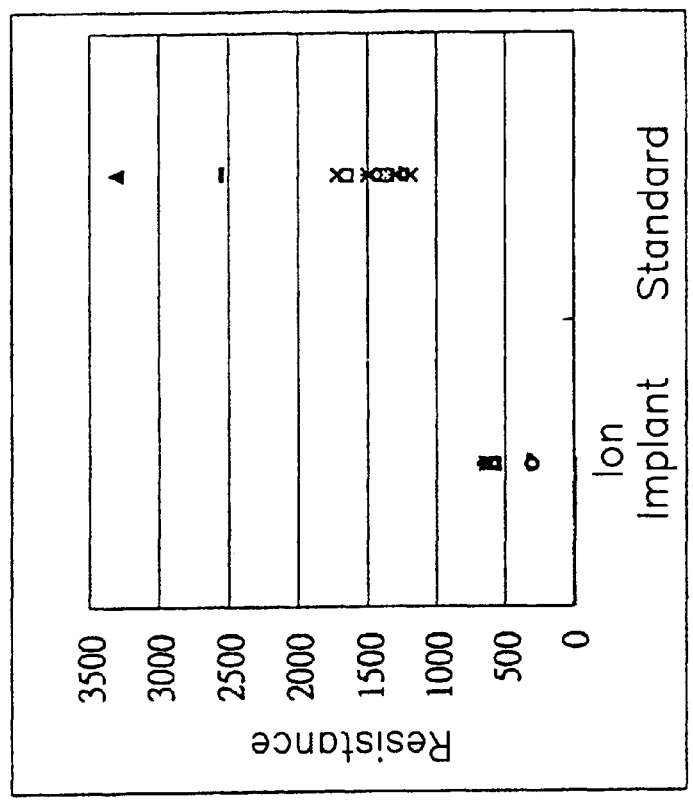
FIGS. 3A~3B are measured experimental results for contact resistance of the bitline fabricated in accordance with the preferred embodiment of the invention.
Figure 3A:
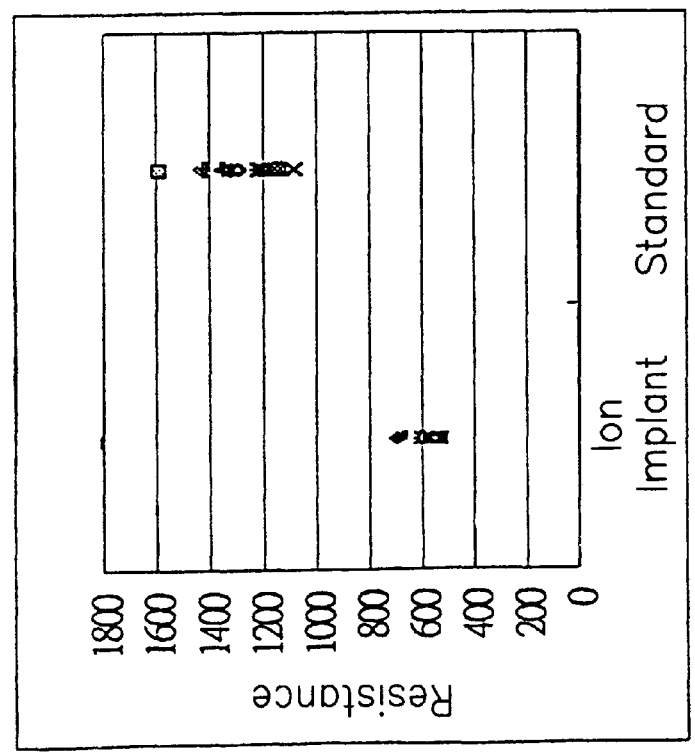

After completing the bitline structure 115, the subsequent process steps includes depositing sequentially a second oxide layer, borophophosilicate glass (BPSG) layer and forming a capacitor (not shown). While forming a dielectric structure consisting of, for example, a three-layered oxide-nitride-oxide (ONO) structure between the bottom electrode and the top electrode for the storage capacitor, a thermal process is performed to form the oxide layer. The thermal process causes the amorphous contact surface 115 to re-grow under high temperatures and to become a better contact surface between the second polysilicon layer 110 and the first polysilicon layer 104. Therefore, contact resistance reduces, to only 50% of the original value of contact resistance. According to FIG. 3A displays measured experimental results for contact resistance of the bitline fabricated in accordance with the preferred embodiment of the invention. After ion implantation, contact resistance between the bitline and the wordline can reduces to fifty percent as compared to the non-implanted bitline. As a result, the thermal process is regarded as an annealing step for the contact surface between the bitline and the wordline, resulting in forming a better contact surface and reducing contact resistance between the bitline and the wordline.

Figure 2A:
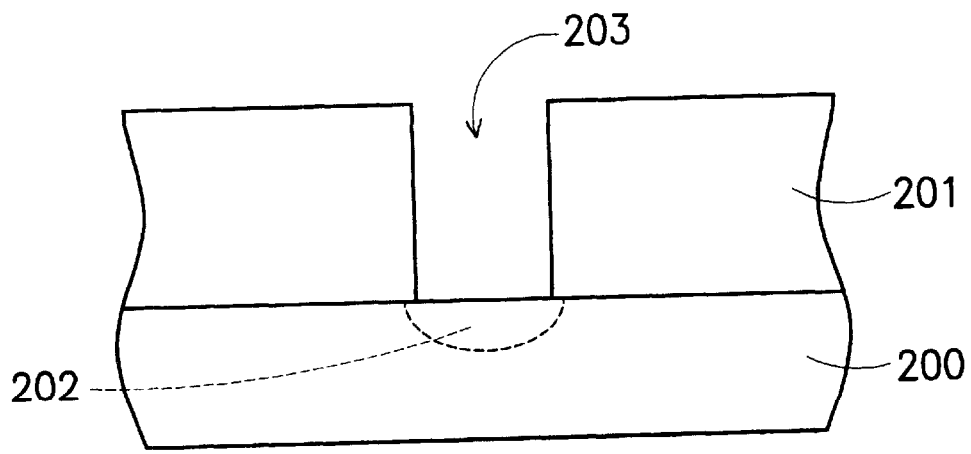
FIGS. 2A~2C are cross-sectional views of a bitline depicted from the processes in accordance with another preferred embodiment of the invention.
Figure 2B:
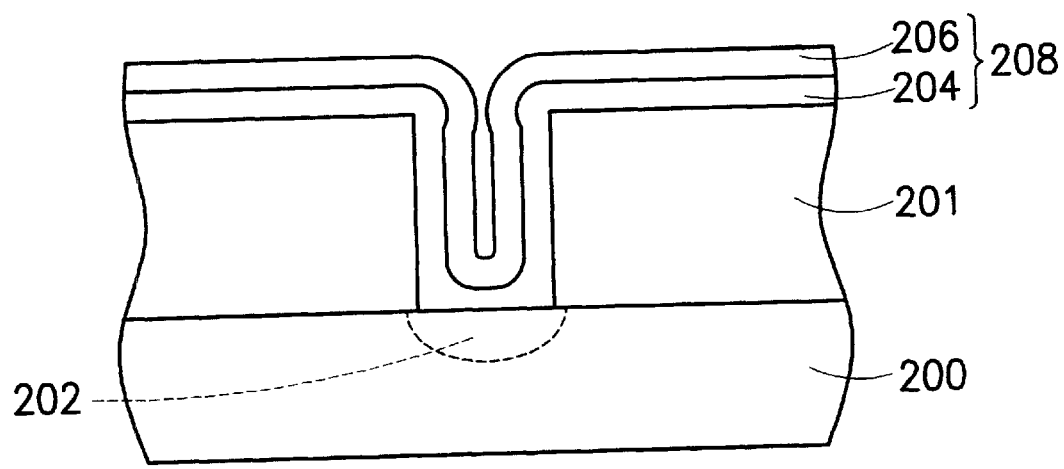
Figure 2C:
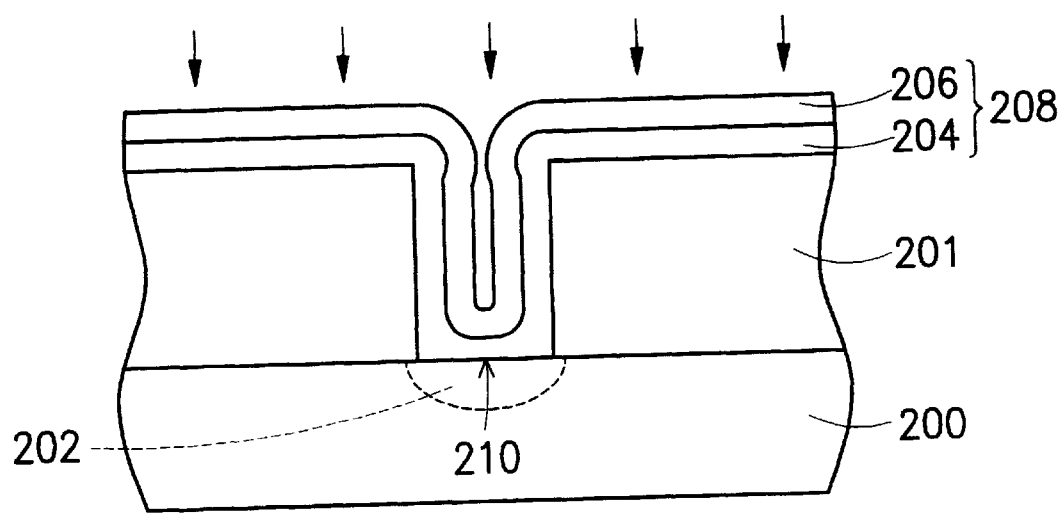

FIGS. 2A~2C are cross-sectional views of a bitline depicted from the processes in accordance with another preferred embodiment of the invention. They can represent a region in the same wafer but different from the region depicted in the previous embodiment, or a region in a different wafer.

Referring to FIG. 2A, a substrate 200, containing a diffusion region 202 and a patterned dielectric layer 201, is provided. The dielectric layer is, for example, a TEOS-oxide layer formed by low-pressure chemical vapor deposition (LPCVD). The patterned dielectric layer 201 is defined by conventional photolithography techniques, so that a bitline contact opening 203 is formed to expose the diffusion region 202. The diffusion region 202 is, for example, a common source/drain region.

Referring to FIG. 2B, depositing a doped polysilicon layer 204 with a thickness of about 1000 Å to cover conformally the bitline contact opening 203. The doped polysilicon layer 204 can be formed by, for example, in-situ doping, increasing conductivity of the polysilicon layer 204. Depositing a tungsten silicide layer 206 with a thickness of about 1000 Å to cover conformally the doped polysilicon layer 204. The tungsten silicide layer 206 is normally formed by, for example, low-pressure chemical vapor deposition (LPCVD) using tungsten hexafluoride as gas supply of tungsten in reaction with silane ($SiH_4$) under 300° C.~400° C. The polysilicon layer 204 and the tungsten silicide layer 206 forms a bitline structure 208.

Referring to FIG. 2C, an ion implantation step is performed (displayed as arrows in the figure) to implant high energy and high dosage N-type ions, for example, phosphorous ions into a contact surface 210 between the polysilicon layer 204 and the diffusion region 202, with a energy of about 100~150 Kev and a dosage of about $2 \times 10^{15} \sim 5 \times 10^{15}$. Because the ions are implanted with high energy, the lattice structure of the contact surface 210 is damaged and becomes amorphous.

After completing the bitline structure 208, a thermal process is performed and causes the amorphous contact surface 210 to re-grow under high temperatures and to become a better contact surface. The thermal process is regarded as an annealing step for the contact surface between the bitline and the diffusion region, resulting in forming a better contact surface and reducing contact resistance between the bitline and the diffusion region. Therefore, contact resistance reduces, to only 40% of the original value of contact resistance. According to FIG. 3B, it displays measured experimental results for contact resistance of the bitline fabricated in accordance with the preferred embodiment of the invention. After ion implantation, contact resistance between the bitline and the wordline can reduces sixty percent as compared to the non-implanted bitline.

As cited in the previous embodiment, the thermal process can be one of the subsequent process steps, such as, steps used for forming the dielectric structure between the bottom electrode and the top electrode for the storage capacitor, or other thermal process depending on the design of the manufacture processes.

Following the method provided in the invention, the bitline forms a better contact surface due to high energy and high dosage ion implantation, thus obtaining the bitline with reduced contact resistance. Furthermore, there is no extra annealing step needed after ion implantation, just using the annealing step in the subsequent processes, so that the thermal budget does not increase at all. The method provided in the invention is therefore compatible with the present manufacture processes used The feature of the invention is to use a high-energy ion implantation step performing to the contact surface of the bitline. A thermal process in the subsequent processes is used as an annealing step to form a better contact surface of the bitline. As a result, contact resistance of the bitline can be effectively reduced.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating bitlines, comprising the steps of:

providing a semiconductor substrate, wherein the substrate contains at least a wordline and a contact opening, wherein the wordline includes a first polysilicon layer, and wherein the contact opening exposes a portion of the first polysilicon layer;

forming a second polysilicon layer to cover a surface of the contact opening and contact the first polysilicon layer;

forming a tungsten silicide layer to cover the second polysilicon layer; and performing an ion implantation step to implant ions to a contact surface between the second polysilicon layer and the first polysilicon layer, wherein an energy for the ion implantation step is from 100 Kev to 150 Kev.

2. The method of claim 1, wherein the method further comprises using a thermal process to anneal the contact surface between the second polysilicon layer and the first polysilicon layer, so that a better contact surface between the second polysilicon layer and the first polysilicon layer is formed.

3. The method of claim 1, wherein the second polysilicon layer is formed by low-pressure chemical vapor deposition.

4. The method of claim 1, wherein the second polysilicon layer has a thickness of about 1000 Å.

5. The method of claim 1, wherein the tungsten silicide layer is formed by low-pressure chemical vapor deposition.

6. The method of claim 5, wherein the tungsten silicide layer is employing a tungsten hexafluoride-containing gas supply.

7. The method of claim 1, wherein the tungsten silicide layer has a thickness of about 1000 Å.

8. The method of claim 1, wherein the ions implanted in the ion implantation step include N-type ions.

9. The method of claim 1, wherein a dosage for the ion implantation step is from $2 \times 10^{15}$ to $5 \times 10^{15}$.

10. A method for fabricating bitlines, comprising the steps of:

providing a semiconductor substrate, wherein the substrate contains at least a contact opening, and wherein the contact opening exposes a diffusion region in the substrate;

forming a polysilicon layer to cover a surface of the contact opening and contact the diffusion region;

forming a tungsten silicide layer to cover the polysilicon layer; and performing an ion implantation step to implant ions to a contact surface between the polysilicon layer and the diffusion region, wherein an energy for the ion implantation step is from 100 Kev to 150 Kev.

11. The method of claim 10, wherein the method further comprises using a thermal process to anneal the contact surface between the polysilicon layer and the diffusion region, so that a better contact surface between the polysilicon layer and the diffusion region is formed.

12. The method of claim 10, wherein the polysilicon layer is formed by low-pressure chemical vapor deposition.

13. The method of claim 10, wherein the polysilicon layer has a thickness of about 1000 Å.

14. The method of claim 10, wherein the tungsten silicide layer is formed by low-pressure chemical vapor deposition.

15. The method of claim 14, wherein the tungsten silicide layer is employing a tungsten hexafluoride-containing gas supply.

16. The method of claim 10, wherein the tungsten silicide layer has a thickness of about 1000 Å.

17. The method of claim 10, wherein the ions implanted in the ion implantation step include N-type ions.

18. The method of claim 10, wherein a dosage for the ion implantation step is from $2 \times 10^{15}$ to $5 \times 10^{15}$.

* * * * *